US008487796B2

(12) United States Patent
Baraniuk et al.

(10) Patent No.: US 8,487,796 B2
(45) Date of Patent: Jul. 16, 2013

(54) METHOD AND APPARATUS FOR AUTOMATIC GAIN CONTROL FOR NONZERO SATURATION RATES

(75) Inventors: Richard G. Baraniuk, Houston, TX (US); Jason N. Laska, Houston, TX (US); Petros T. Boufounos, Boston, MA (US); Mark A. Davenport, Los Altos Hills, CA (US)

(73) Assignee: William Marsh Rice University, Houston, TX (US)

( * ) Notice: Subject to any disclaimer, the term of this patent is extended or adjusted under 35 U.S.C. 154(b) by 134 days.

(21) Appl. No.: 13/033,188

(22) Filed: Feb. 23, 2011

(65) Prior Publication Data

US 2011/0215856 A1 Sep. 8, 2011

Related U.S. Application Data

(60) Provisional application No. 61/306,992, filed on Feb. 23, 2010.

(51) Int. Cl.
*H03M 1/84* (2006.01)

(52) U.S. Cl.
USPC .......................................... 341/139; 341/155

(58) Field of Classification Search
USPC ................................................. 341/139, 155
See application file for complete search history.

(56) References Cited

U.S. PATENT DOCUMENTS

| 5,392,074 | A | * | 2/1995 | Watanabe et al. ............. 348/647 |
| 5,617,060 | A | * | 4/1997 | Wilson et al. ................. 330/129 |
| 7,212,795 | B2 | * | 5/2007 | Liu et al. ..................... 455/232.1 |
| 7,271,747 | B2 | | 9/2007 | Baraniuk et al. |
| 7,408,493 | B2 | * | 8/2008 | Lusky et al. .................. 341/139 |
| 7,511,643 | B2 | | 3/2009 | Baraniuk et al. |
| 2006/0029279 | A1 | | 2/2006 | Donoho |

OTHER PUBLICATIONS

J. Tropp, J. Laska, M. Duarte, J. Romberg, and R. Baraniuk, "Beyond Nyquist: Efficient sampling of sparse, bandlimited signals," to appear in IEEE Trans. Inform. Theory, 2009.

J. Romberg, "Compressive sensing by random convolution," to appear in Siam J. Imaging Sciences, 2009.

J. Tropp, M. Wakin, M. Duarte, D. Baron, and R. Baraniuk, "Random filters for compressive sampling and reconstruction," in Proc. IEEE Int. Conf. Acoustics, Speech, and Signal Processing (ICASSP), Toulouse, France, May 2006.

M. Duarte, M. Davenport, D. Takhar, J. Laska, T. Sun, K. Kelly, and R. Baraniuk, "Single-pixel imaging via compressive sampling," IEEE Signal Processing Mag., vol. 25, No. 2, pp. 83-91, 2008.

(Continued)

*Primary Examiner* — Brian Young
(74) *Attorney, Agent, or Firm* — 24IP Law Group; Timothy R DeWitt

(57) ABSTRACT

A method for automatic gain control comprising the steps of measuring a signal using compressed sensing to produce a sequence of blocks of measurements, applying a gain to one of the blocks of measurements, adjusting the gain based upon a deviation of a saturation rate of the one of the blocks of measurements from a predetermined nonzero saturation rate and applying the adjusted gain to a second of the blocks of measurements. Alternatively, a method for automatic gain control comprising the steps of applying a gain to a signal, computing a saturation rate of the signal and adjusting the gain based upon a difference between the saturation rate of the signal and a predetermined nonzero saturation rate.

7 Claims, 3 Drawing Sheets

OTHER PUBLICATIONS

R. Robucci, L. Chiu, J. Gray, J. Romberg, P. Hasler, and D. Anderson, "Compressive sensing on a CMOS separable reconstruction," in Proc. IEEE Int. Conf. Acoustics, Speech, and Signal Processing (ICASSP), Las Vegas, NV, 2008.

R. Marcia, Z. Harmany, and R. Willett, "Compressive coded aperture imaging," in Proc. SPIE Symp. Elec. Imaging: Comput. Imaging, San Jose, CA, Jan. 2009.

Y. Eldar and M. Mishali, "Robust recovery of signals from a structured union of subspaces," to appear in IEEE Trans. Inform. Theory, 2009.

M. Mishali, Y. Eldar, and J. Tropp, "Efficient sampling of sparse wideband analog signals," in Proc. Conv. IEEE in Israel (IEEEI), Eilat, Israel, Dec. 2008.

M. Mishali and Y. Eldar, "From theory to practice: Sub-Nyquist sampling of sparse wideband analog signals," Preprint, 2009.

G. Gray and G. Zeoli, "Quantization and saturation noise due to analog-to-digital conversion," IEEE Trans. Aerospace and Elec. Systems, vol. 7, No. 1, pp. 222-223, 1971.

E. Cand'es and T. Tao, "Decoding by linear programming," IEEE Trans. Inform. Theory, vol. 51, No. 12, pp. 4203-4215, 2005.

R. Baraniuk, M. Davenport, R. DeVore, and M. Wakin, "A simple proof of the restricted isometry property for random matrices," Const. Approx., vol. 28, No. 3, pp. 253-263, 2008.

E. Cand'es, "The restricted isometry property and its implications for compressed sensing," Comptes rendus de l'Acad'emie des Sciences, S'erie I, vol. 346, No. 9-10, pp. 589-592, 2008.

E. Cand'es and T. Tao, "The Dantzig selector: Statistical estimation when p is much larger than n," Annals of Statistics, vol. 35, No. 6, pp. 2313-2351, 2007.

P. Wojtaszczyk, "Stability and instance optimality for Gaussian measurements in compressed sensing," to appear in Found. Comput. Math., 2009.

R. Robucci, L. Chiu, J. Gray, J. Romberg, P. Hasler, and D. Anderson, "Compressive sensing on a CMOS separable transform image sensor," in Proc. IEEE Int. Conf. Acoustics, Speech, and Signal Processing (ICASSP), Las Vegas, NV, Apr. 2008.

J. Treichler, M. Davenport, and R. Baraniuk, "Application of compressive sensing to the design of wideband signal acquisition receivers," in U.S./Australia Joint Work. Defense Apps. of Signal Processing (DASP), Lihue, Hawaii, Sep. 2009.

J. Triechler, Personal Communication, Oct. 2009.

\* cited by examiner

METHOD AND APPARATUS FOR AUTOMATIC GAIN CONTROL FOR NONZERO SATURATION RATES

CROSS-REFERENCE TO RELATED APPLICATIONS

The present application claims the benefit of the filing date of U.S. Provisional Patent Application Ser. No. 61/306,992 filed by the present inventors on Feb. 23, 2010.

The aforementioned provisional patent application is hereby incorporated by reference in its entirety.

STATEMENT REGARDING FEDERALLY SPONSORED RESEARCH OR DEVELOPMENT

This invention was made with government support under National Science Foundation Grant Nos. CCF-0431150, CCF-0728867, CNS-0435425 and CNS-0520280, DARPA Grant No. N66001-08-1-2065, Office of Naval Research Grant Nos. N00014-07-1-0936, N00014-08-1-1067, N00014-08-1-1112, and N00014-08-1-1066, Air Force Office of Scientific Research Grant Nos. FA9550-07-1-0301, and Department of Defense—Army Research Laboratory Grant Nos W911NF-07-1-0185, and W911NF-09-1-0383. The government has certain rights in the invention.

1 BACKGROUND OF THE INVENTION 1.1 Field of the Invention

The present invention relates to methods and apparatus for controlling the gain of signals before sampling and quantization. The invention further relates to methods that use randomized measurement systems, democratic measurement systems, and compressive measurement systems. The invention is applicable to any type of signal or sampling and quantization system, however, its inherent properties will only be beneficial to some.

1.2 Brief Description of the Related Art 1.2.1 Analog-to-digital Conversion

Analog-to-digital conversion (ADC) consists of two discretization steps: sampling, which converts a continuous-time signal to a discrete-time set of measurements, followed by quantization, which converts the continuous value of each measurement to a discrete one chosen from a pre-determined, finite set. Both steps are necessary to represent an analog signal in the discrete digital world.

The discretization step can be lossless or lossy. For example, classical results due to Shannon and Nyquist demonstrate that the sampling step induces no loss of information, provided that the signal is bandlimited and a sufficient number of measurements (or samples) are obtained. Similarly, sensing of images assumes that the image is sufficiently smooth such that the integration of light in each pixel of the sensor is sufficient for a good quality representation of the image. The present invention relies the existence of a discretization that exactly represents the signal, or approximates the signal to sufficient quality. Examples of such discretizations and their implementation in the context of compressive sensing can be found in J. Tropp, J. Laska, M. Duarte, J. Romberg, and R. Baraniuk, "Beyond Nyquist: Efficient sampling of sparse, bandlimited signals," to appear in *IEEE Trans. Inform. Theory,* 2009, J. Romberg, "Compressive sensing by random convolution," to appear in *SIAM J. Imaging Sciences,* 2009, J. Tropp, M. Wakin, M. Duarte, D. Baron, and R. Baraniuk, "Random filters for compressive sampling and reconstruction," in *Proc. IEEE Int. Conf. Acoustics, Speech, and Signal Processing (ICASSP),* Toulouse, France, May 2006, M. Duarte, M. Davenport, D. Takhar, J. Laska, T. Sun, K. Kelly, and R. Baraniuk, "Single-pixel imaging via compressive sampling," *IEEE Signal Processing Mag., vol. 25, no. 2, pp. 83-91, 2008, R. Robucci, L. Chiu, J. Gray, J. Romberg,

TABLE 1

| Quantization parameters. | |
| --- | --- |
| G | saturation level |
| B | number of bits |
| Δ | bin width |
| Δ/2 | maximum error per (quantized) measurement |
| unbounded | maximum error per (saturated) measurement |

P. Hasler, and D. Anderson, "Compressive sensing on a CMOS separable transform image sensor," in *Proc. IEEE Int. Conf. Acoustics, Speech, and Signal Processing (ICASSP),* Las Vegas, Nev., April 2008, R. Marcia, Z. Harmany, and R. Willett, "Compressive coded aperture imaging," in *Proc. SPIE Symp. Elec. Imaging: Comput. Imaging,* San Jose, Calif., January 2009, Y. Eldar and M. Mishali, "Robust recovery of signals from a structured union of subspaces," to appear in *IEEE Trans. Inform. Theory,* 2009, M. Mishali, Y. Eldar, and J. Tropp, "Efficient sampling of sparse wideband analog signals," in *Proc. Conv. IEEE in Israel (IEEEI),* Eilat, Israel, December 2008, M. Mishali and Y. Eldar, "From theory to practice: Sub-Nyquist sampling of sparse wideband analog signals," Preprint, 2009, Y. Eldar and M. Mishali, "Robust recovery of signals from a structured union of subspaces," to appear in *IEEE Trans. Inform. Theory,* 2009. Certain aspects of such systems are discussed briefly below in Sec. 1.2.4.

Instead, the present discussion is focused on the second aspect of digitization, namely quantization. Quantization results in an irreversible loss of information unless the measurement amplitudes belong to the discrete set defined by the quantizer. A central ADC system design goal is to minimize the distortion due to quantization.

1.2.2 Scalar Quantization

Scalar quantization is the process of converting the continuous value of an individual measurement to one of several discrete values through a non-invertible function $R(\cdot)$. Practical quantizers introduce two kinds of distortion: bounded quantization error and unbounded saturation error.

In a preferred embodiment of our invention, we focus on uniform quantizers with quantization interval $\Delta$. Thus, the quantized values become $q_k = q_0 + k\Delta$, for $k \in \mathbb{Z}$, and every measurement g is quantized to the nearest quantization level $R(g) = \mathrm{argmin}_{q_k}|g - q_k| = \Delta/2 + k\Delta$, the midpoint of each quantization interval. This minimizes the expected quantization distortion and implies that the quantization error per measurement, $|g - R(q)|$, is bounded by $\Delta/2$. FIG. 1A depicts the mapping performed by a midrise quantizer.

In practice, quantizers have a finite dynamic range, dictated by hardware constraints such as the voltage limits of the devices and the finite number of bits per measurement of the quantized representation. Thus, a finite-range quantizer represents a symmetric range of values $|g| < G$, where $G > 0$ is known as the saturation level G. Gray and G. Zeoli, "Quantization and saturation noise due to analog-to-digital conversion," *IEEE Trans. Aerospace and Elec. Systems,* vol. 7, no. 1, pp. 222-223, 1971. Values of g between −G and G will not saturate, thus, the quantization interval is defined by these parameters as $\Delta = 2^{-B+1}G$. Without loss of generality we assume a midrise B-bit quantizer, i.e., the quantization levels are $q_k = \Delta/2 + k\Delta$, where $k = -2^{B-1}, \ldots, 2^{B-1}-1$. Any measurement with magnitude greater than G saturates the quantizer, i.e., it quantizes to the quantization level G−Δ/2, implying an unbounded error. FIG. 1B depicts the mapping performed by a finite range midrise quantizer with saturation level G and Table 1 summarizes the parameters defined with respect to quantization.

1.2.3 Compressive Sensing (CS)

In the CS framework, we acquire a signal $x \in \mathbb{R}^N$ via the linear measurements $$y = \Phi x + e, \quad (1)$$

where $\Phi$ is an M×N measurement matrix modeling the sampling system, $y \in \mathbb{R}^M$ is the vector of samples acquired, and e is an M×1 vector that represents measurement errors. If x is K-sparse when represented in the sparsity basis $\Psi$, i.e., $x = \Psi \alpha$ with $\|\alpha\|_0 := |\mathrm{supp}(\alpha)| \leq K$, then one can acquire just $M = O(K \log(N/K))$ measurements and still recover the signal x. A similar guarantee can be obtained for approximately sparse, or compressible, signals. Observe that if K is small, then the number of measurements required can be significantly smaller than the Shannon-Nyquist rate.

In E. Candès and T. Tao, "Decoding by linear programming," *IEEE Trans. Inform. Theory*, vol. 51, no. 12, pp. 4203-4215, 2005, Candès and Tao introduced the restricted isometry property (RIP) of a matrix $\Phi$ and established its important role in CS. From E. Candès and T. Tao, "Decoding by linear programming," *IEEE Trans. Inform. Theory*, vol. 51, no. 12, pp. 4203-4215, 2005, we have the definition, Definition 1. A matrix $\Phi$ satisfies the RIP of order K with constant $\delta \in (0,1)$ if $$(1-\delta)\|x\|_2^2 \leq \|\Phi x\|_2^2 \leq (1+\delta)\|x\|_2^2 \quad (2)$$

holds for all x such that $\|x\|_0 \leq K$.

In words, $\Phi$ acts as an approximate isometry on the set of vectors that are K-sparse in the basis $\Psi$. An important result is that for any unitary matrix $\Psi$, if we draw a random matrix $\Phi$ whose entries $\phi_{ij}$ are independent realizations from a sub-Gaussian distribution, then $\Phi\Psi$ will satisfy the RIP of order K with high probability provided that $M = O(K \log(N/K))$ R. Baraniuk, M. Davenport, R. DeVore, and M. Wakin, "A simple proof of the restricted isometry property for random matrices," *Const. Approx.*, vol. 28, no. 3, pp. 253-263, 2008. Without loss of generality, we fix $\Psi = I$, the identity matrix, implying that $x = \alpha$.

The RIP is a necessary condition if we wish to be able to recover all sparse signals x from the measurements y. Specifically, if $\|x\|_0 = K$, then $\Phi$ must satisfy the lower bound of the RIP of order 2K with $\delta < 1$ in order to ensure that any algorithm can recover x from the measurements y. Furthermore, the RIP also suffices to ensure that a variety of practical algorithms can successfully recover any sparse or compressible signal from noisy measurements. In particular, for bounded errors of the form $\|e\|_2 \leq \epsilon$, the convex program $$\hat{x} = \arg\min_x \|x\|_1 \text{ s.t. } \|\Phi x - y\|_2 \leq \epsilon \quad (3)$$

can recover a sparse or compressible signal x. The following theorem, a slight modification of Theorem 1.2 from E. Candès, "The restricted isometry property and its implications for compressed sensing," *Comptes rendus de l'Académie des Sciences, Série I*, vol. 346, no. 9-10, pp. 589-592, 2008, makes this precise by bounding the recovery error of x with respect to the measurement noise norm, denoted by $\epsilon$, and with respect the best approximation of x by its largest K terms, denoted using $x_K$.

Theorem 1. Suppose that $\Phi\Psi$ satisfies the RIP of order 2K with $\delta < \sqrt{2} - 1$. Given measurements of the form $y = \Phi\Psi x + e$, where $\|e\|_2 \leq \epsilon$, then the solution to (3) obeys $$\|\hat{x} - x\|_2 \leq C_0 \epsilon + C_1 \frac{\|x - x_K\|_1}{\sqrt{K}},$$

where $$C_0 = \frac{4(1+\delta)}{1-(\sqrt{2}+1)\delta}, \quad C_1 = \frac{1+(\sqrt{2}-1)\delta}{1-(\sqrt{2}+1)\delta}.$$

While convex optimization techniques like equation (3) are a powerful method for CS signal recovery, there also exist a variety of alternative algorithms that are commonly used in practice and for which performance guarantees comparable to that of Theorem 1 can be established. In particular, iterative algorithms such as CoSaMP and iterative hard thresholding (IHT) are known to satisfy similar guarantees under slightly stronger assumptions on the RIP constants. Furthermore, alternative recovery strategies based on (3) have been analyzed in E. Candès and T. Tao, "The Dantzig selector: Statistical estimation when p is much larger than n," *Annals of Statistics*, vol. 35, no. 6, pp. 2313-2351, 2007, P. Wojtaszczyk, "Stability and instance optimality for Gaussian measurements in compressed sensing," to appear in *Found. Comput. Math.*, 2009. These methods replace the constraint in (3) with an alternative constraint that is motivated by the assumption that the measurement noise is Gaussian in the case of E. Candès and T. Tao, "The Dantzig selector: Statistical estimation when p is much larger than n," *Annals of Statistics*, vol. 35, no. 6, pp. 2313-2351, 2007 and that is agnostic to the value of $\epsilon$ in P. Wojtaszczyk, "Stability and instance optimality for Gaussian measurements in compressed sensing," to appear in *Found. Comput. Math.*, 2009.

1.2.4 CS in Practice

Several hardware architectures have been proposed and implemented that allow CS to be used in practical settings with analog signals. Examples include the random demodulator, random filtering, and random convolution for signals. J. Tropp, J. Laska, M. Duarte, J. Romberg, and R. Baraniuk, "Beyond Nyquist: Efficient sampling of sparse, bandlimited signals," to appear in *IEEE Trans. Inform. Theory*, 2009, as well as the modulated wideband converter for multiband signals, and several compressive imaging architectures M. Duarte, M. Davenport, D. Takhar, J. Laska, T. Sun, K. Kelly, and R. Baraniuk, "Single-pixel imaging via compressive sampling," *IEEE Signal Processing Mag.*, vol. 25, no. 2, pp. 83-91, 2008, R. Robucci, L. Chiu, J. Gray, J. Romberg, P. Hasler, and D. Anderson, "Compressive sensing on a CMOS separable transform image sensor," in *Proc. IEEE Int. Conf. Acoustics, Speech, and Signal Processing (ICASSP)*, Las Vegas, Nev., April 2008, R. Marcia, Z. Harmany, and R. Willett, "Compressive coded aperture imaging," in *Proc. SPIE Symp. Elec. Imaging: Comput. Imaging*, San Jose, Calif., January 2009.

A random demodulator is briefly described as an example of such a system in J. Tropp, J. Laska, M. Duarte, J. Romberg, and R. Baraniuk, "Beyond Nyquist: Efficient sampling of sparse, bandlimited signals," to appear in *IEEE Trans. Inform. Theory*, 2009. FIG. 2 depicts the block diagram of the random demodulator. The four key components are a pseudo-random ±1 "chipping sequence" $p_c(t)$ operating at the Nyquist rate or higher, a low pass filter, often represented by an ideal integrator with reset, a low-rate ADC, and a quantizer. An input analog signal x(t) is modulated by the chipping sequence and integrated. The output of the integrator is sampled, and the integrator is reset after each sample. The output measurements from the ADC are then quantized.

Systems such as these represent a linear operator mapping the analog input signal to a discrete output vector, followed by a quantizer. It is possible, but beyond the scope of this description, to relate this operator to a discrete measurement matrix Φ which maps, for example, the Nyquist-rate samples of the input signal to the discrete output vector J. Tropp, J. Laska, M. Duarte, J. Romberg, and R. Baraniuk, "Beyond Nyquist: Efficient sampling of sparse, bandlimited signals," to appear in *IEEE Trans. Inform. Theory*, 2009, M. Mishali and Y. Eldar, "From theory to practice: Sub-Nyquist sampling of sparse wideband analog signals," *Preprint*, 2009, J. Treichler, M. Davenport, and R. Baraniuk, "Application of compressive sensing to the design of wideband signal acquisition receivers," in *U.S./Australia Joint Work. Defense Apps. of Signal Processing (DASP)*, Lihue, Hi., September 2009. In this application the description is focused on settings in which the measurement operator Φ can be represented as an M×N matrix.

1.2.5 Saturation and Compressive Sensing

It has been shown that CS systems can be made robust to saturated measurements. One approach simply discards saturated measurements and performs signal reconstruction without them. Another approach is based on an alternative CS recovery algorithm that treats saturated measurements differently from unsaturated ones. This is achieved by employing a magnitude constraint on the indices of the saturated measurements while maintaining the conventional regularization constraint on the indices of the other measurements.

These methods exploit the democratic nature of CS measurements. Because each measurement contributes equally to the compressed representation, some of them can be removed while still maintaining a sufficient amount of information about the signal to enable recovery.

When employing these methods, in order to maximize the acquisition SNR, the optimal strategy is to allow the quantizer to saturate at some nonzero rate. This is due to the inverse relationship between quantization error and saturation rate: as the saturation rate increases, the distortion of remaining measurements decreases. Furthermore, experimental results show that on average, the optimal SNR is achieved at nonzero saturation rates.

2 SUMMARY OF THE INVENTION

To adapt to changes in signal power and to avoid saturation events, modern sampling systems employ automatic gain control (AGC). These AGC's typically target saturation rates that are close to zero. In this case, saturation events can be used to detect high signal strength; however detecting low signal strength is more difficult. Thus, in conventional systems, saturation rate alone does not provide sufficient feedback to perform automatic gain control. Other measures, such as measured signal power are used in addition to saturation rate to ensure that the signal gain is sufficiently low but not too low.

However, when a positive saturation rate is desirable, the saturation rate can by itself provide sufficient feedback to the AGC circuit. Since the desired rate is significantly greater than zero, deviation from the desired rate can be used to both increase and decrease the gain in an AGC circuit to maintain a target saturation rate. Saturation events can be detected more easily and at earlier stages of the signal acquisition systems compared to measures such as the signal variance. Thus the effectiveness of AGC increases and the cost decreases.

In a preferred embodiment, the present invention is a method for automatic gain control. The method comprises splitting a signal into consecutive blocks, applying a measurement matrix to each block separately to produce a plurality of measurements for each consecutive block, indexing each successive block of measurements, applying a window to each successive block of measurements, applying a gain to a block of measurements, quantizing the block of measurements to produce a set of output measurements, calculating a saturation rate of the block of measurements and calculating a new gain to apply to a next block of measurements by adding an error between a desired non-zero saturation rate and the computed saturation rate of the block to the gain. The window applied to each block may comprise a boxcar window or any other window. The quantizing step may comprise uniform or non-uniform quantizing.

In another embodiment, the present invention is a method for automatic gain control. The method comprises the steps of measuring a signal using compressed sensing to produce a sequence of blocks of measurements, applying a gain to one of the blocks of measurements, adjusting the gain based upon a deviation of a saturation rate of the one of the blocks of measurements from a predetermined nonzero saturation rate and applying the adjusted gain to a second of the blocks of measurements.

In still another embodiment, the present invention is a method for automatic gain control. The method comprises the steps of applying a gain to a signal, computing a saturation rate of the signal and adjusting the gain based upon a difference between the saturation rate of the signal and a predetermined nonzero saturation rate.

Still other aspects, features, and advantages of the present invention are readily apparent from the following detailed description, simply by illustrating a preferable embodiments and implementations. The present invention is also capable of other and different embodiments and its several details can be modified in various obvious respects, all without departing from the spirit and scope of the present invention. Accordingly, the drawings and descriptions are to be regarded as illustrative in nature, and not as restrictive. Additional objects and advantages of the invention will be set forth in part in the description which follows and in part will be obvious from the description, or may be learned by practice of the invention.

3 BRIEF DESCRIPTION OF THE DRAWINGS

For a more complete understanding of the present invention and the advantages thereof, reference is now made to the following description and the accompanying drawings, in which:

FIG. 1 is a drawing of the scalar quantization function. FIG. 1A shows a midrise scalar quantizer. FIG. 1B shows a finite-range midrise scalar quantizer with saturation level G.

FIG. 4 is a drawing of the performance of a preferred embodiment of the CS AGC of the present invention in practice. FIG. 4A illustrates CS measurements with no saturation. Signal strength drops by 90% at measurement 900. FIG. 4B illustrates output gain from AGC. FIG. 4C Measurements scaled by gain from AGC. FIG. 4D Saturation rate of scaled measurements. This figure demonstrates that the CS AGC is sensitive to decreases in signal strength.

4 DETAILED DESCRIPTION OF THE PREFERRED EMBODIMENTS

The notation for the description of the present invention is as follows. The signal x is split into consecutive blocks of length N, and Φ 310 is applied to each block separately such that there are M measurements per block. Each successive block of measurements is indexed by w and is denoted with the superscript [•]. In this example a boxcar window is applied to each block of x, but in general any window can be applied. For each block, a gain $\theta^{[w]}$ 320 is applied to the measurements and then quantized 330, resulting in a set of M output measurements $R\{\theta^{[w]}y^{[w]}\}$. Note that in different hardware implementations, the gain 320 might be applied before, after, or within the measurement matrix Φ 310; this change does not fundamentally affect the design. A goal is to tune the gain so that it produces a desired measurement saturation rate s. It also is assumed that the signal energy does not deviate significantly between consecutive blocks.

Figure 1A:
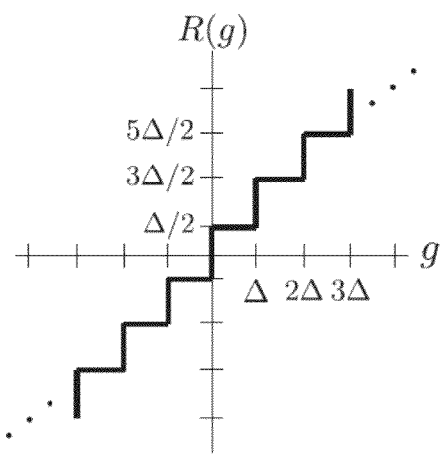
Figure 1B:
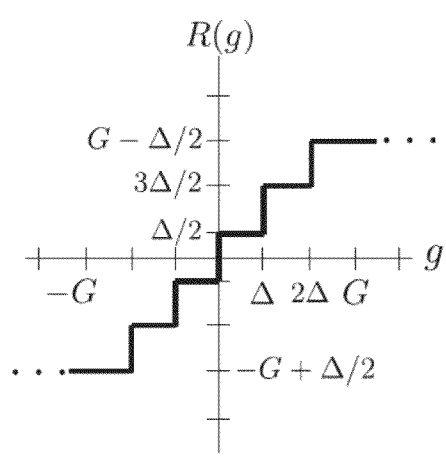
Figure 2:
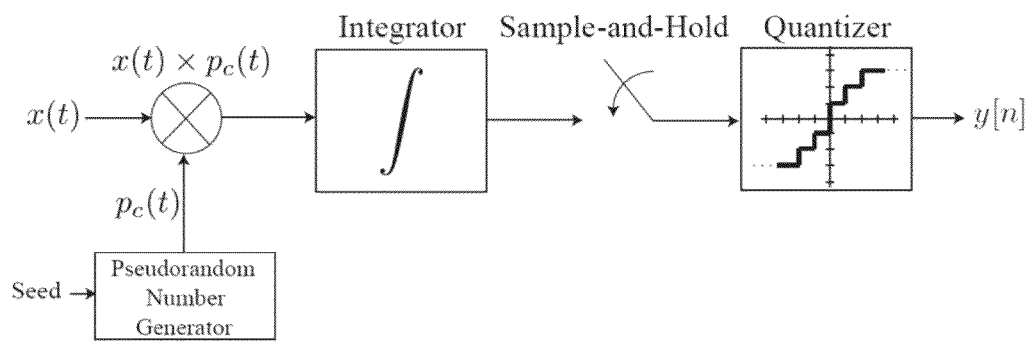
FIG. 2 is a drawing of the random demodulator compressive ADC.
Figure 3:
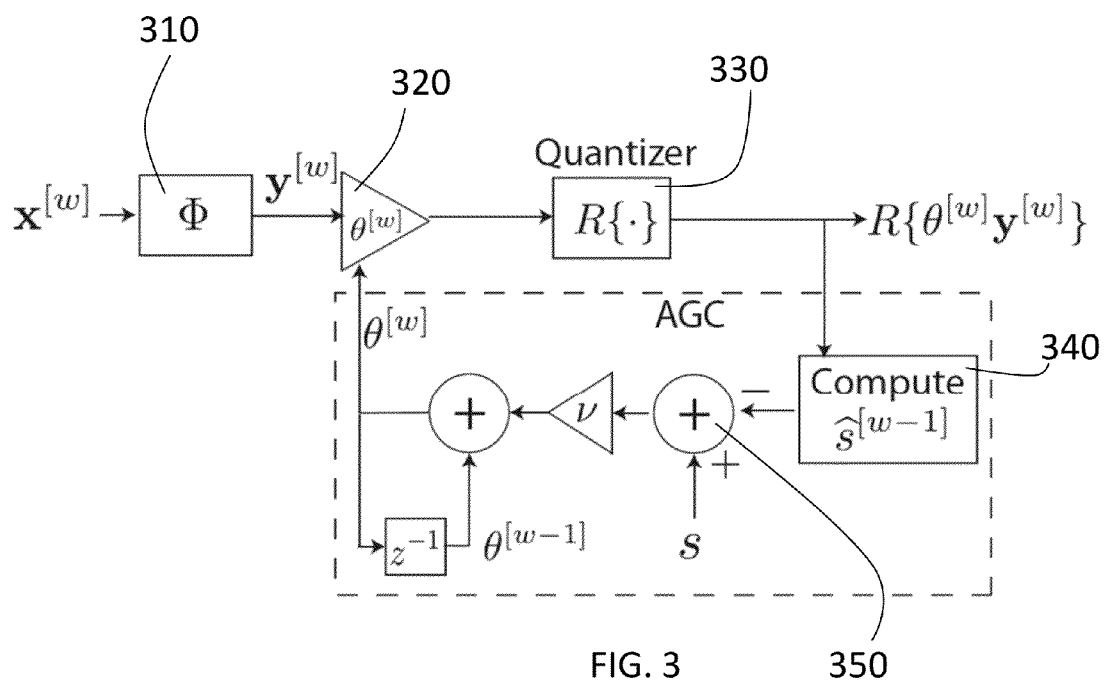
FIG. 3 is a diagram of an automatic gain control (AGC) system for tuning to nonzero saturation rates in CS systems in accordance with a preferred embodiment of the present invention.

A drawing of a preferred embodiment of the present invention is depicted in FIG. 3 and the description is as follows. The saturation rate of the previous block of measurements, $\hat{s}^{[w-1]}$, is computed 340 after quantization. The new gain is then computed by adding 350 the error between s and $\hat{s}^{[w-1]}$ to the previous gain, i.e., $$\theta^{[w]} = \theta^{[w-1]} + v(s - \hat{s}^{[w-1]}), \quad (4)$$

where v>0 is constant. This negative feedback system is BIBO (Bounded Input Bounded Output) stable for any finite positive v with 0<s<1. Oppenheim and A. Willsky, *Signals and systems*. Prentice-Hall, 1996.

Typical AGC designs target saturation rates close to zero. For instance, according to one rule of thumb, a conventional AGC should set the gain such that there is an average of 63 clips per million samples J. Triechler, Personal Communication, October 2009. Thus, because the desired saturation rate is close to zero, saturation rate alone cannot be used to design a stable AGC. However, the present invention is novel in that we consider nonzero saturation rates and thus an AGC in accordance with the present invention need only the saturation rate to determine the gain.

Figure 4A:
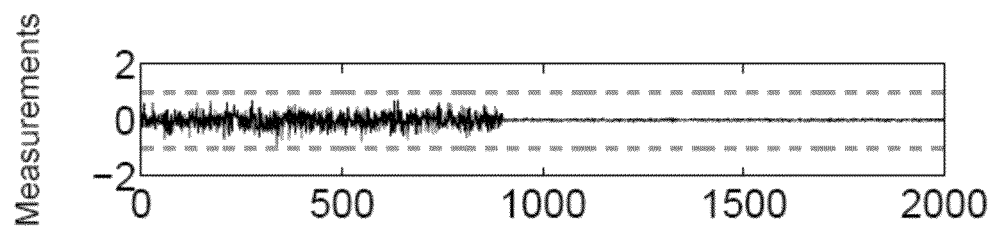

To demonstrate that this AGC is sensitive to both increases in signal strength as well as decreases, an experiment was performed where the signal strength drops suddenly and significantly. The experiment is depicted in FIG. 4 and was performed as follows. A signal was generated such that the parameters per block were N=512, K=5, and M=32. We generated 63 blocks resulting in approximately 2000 measurements in total. The example measurements before the AGC is applied are depicted in FIG. 4A. The dashed lines represent the quantizer range [−1, 1]. We generated the measurements so that the saturation rate is zero, and starting at measurement 900, the signal strength drops by 90%. These measurements are input into the AGC previously described with v=12 and we set a desired saturation rate of s=0.2.

Figure 4B:
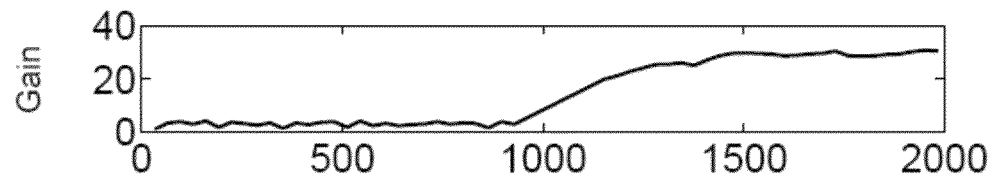
Figure 4C:
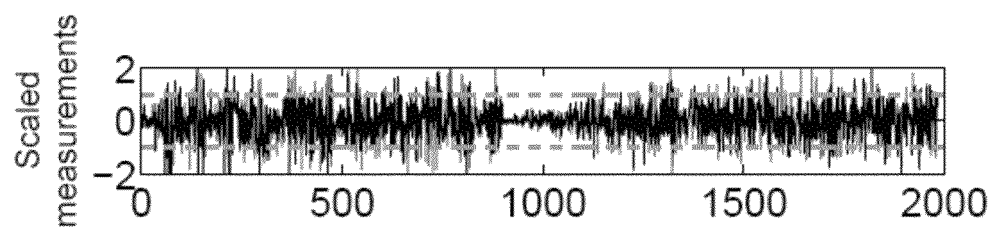
Figure 4D:
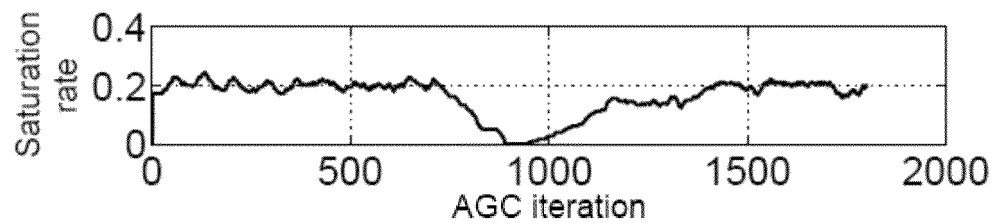

FIG. 4B shows the gain that the AGC applies as it receives each measurement. FIG. 4C shows the resulting output signal with quantizer range, and FIG. 4D shows the estimated output saturation rate. Initially, we achieve the desired saturation rate of 0.2 within approximately 10 iterations. The system adapts to the sudden change in signal strength after measurement 900 within approximately 500 iterations. This experiment demonstrates that the saturation rate is by itself sufficient to tune the gain of CS systems.

Of course more elaborate gain update loops can be considered to provide better adaptability and more rapid updates to the gain from block to block.

The foregoing description of the preferred embodiment of the invention has been presented for purposes of illustration and description. It is not intended to be exhaustive or to limit the invention to the precise form disclosed, and modifications and variations are possible in light of the above teachings or may be acquired from practice of the invention. The embodiment was chosen and described in order to explain the principles of the invention and its practical application to enable one skilled in the art to utilize the invention in various embodiments as are suited to the particular use contemplated. It is intended that the scope of the invention be defined by the claims appended hereto, and their equivalents. The entirety of each of the aforementioned documents is incorporated by reference herein.

What is claimed is:

1. A method for automatic gain control comprising:
   splitting a signal into consecutive blocks;
   applying a measurement matrix to each said block separately to produce a plurality of measurements for each consecutive block;
   indexing each successive block of measurements;
   applying a window to each successive block of measurements;
   applying a gain to a block of measurements;
   quantizing said block of measurements to produce a set of output measurements;
   calculating a saturation rate of said block of measurements; and
   calculating a new gain to apply to a next block of measurements by adding an error between a desired non-zero saturation rate and said computed saturation rate of said block to said gain.

2. A method according to claim 1, wherein said window applied to each block comprises a boxcar window.

3. A method according to claim 1 wherein quantizing step comprises uniform quantizing.

4. A method according to claim 1 wherein said quantizing step comprises non-uniform quantizing.

5. A method for automatic gain control comprising the steps of:
   measuring a signal using compressed sensing to produce a sequence of blocks of measurements;
   applying a gain to one of said blocks of measurements;
   adjusting said gain based upon a deviation of a saturation rate of said one of said blocks of measurements from a predetermined nonzero saturation rate; and
   applying said adjusted gain to a second of said blocks of measurements.

6. A method for automatic gain control comprising the steps of:
   applying a gain to a signal;
   computing a saturation rate of a group of measurements of said signal; and
   adjusting said gain based upon a difference between said computed saturation rate of said group of measurements of said signal and a predetermined nonzero saturation rate.

7. A method for automatic gain control according to claim 6, wherein said predetermined nonzero saturation rate is approximately 0.2.

\* \* \* \* \*